(12) United States Patent
Yi

(10) Patent No.: US 8,623,771 B2
(45) Date of Patent: Jan. 7, 2014

(54) METHOD FOR FABRICATING MICROPATTERN OF SEMICONDUCTOR DEVICE

(75) Inventor: Hong-Gu Yi, Ichon-shi (KR)

(73) Assignee: SK hynix Inc., Icheon-si (KR)

( * ) Notice: Subject to any disclaimer, the term of this patent is extended or adjusted under 35 U.S.C. 154(b) by 911 days.

(21) Appl. No.: 12/165,418

(22) Filed: Jun. 30, 2008

(65) Prior Publication Data

US 2009/0061638 A1    Mar. 5, 2009

(30) Foreign Application Priority Data

Aug. 31, 2007  (KR) .......................... 10-2007-0088214

(51) Int. Cl.
*H01L 21/302* (2006.01)
*H01L 21/461* (2006.01)

(52) U.S. Cl.
USPC .............. 438/717; 438/689; 438/700; 216/41

(58) Field of Classification Search
USPC ......... 438/702, 743, 700, 301, 689, 698, 690, 438/231, 592, 717, 692; 257/734, 20; 216/41, 40; 430/312, 313, 314; 361/321.4
See application file for complete search history.

(56) References Cited

U.S. PATENT DOCUMENTS

| 5,132,173 | A  | * | 7/1992  | Hashimoto et al. | ........... 428/336 |
| 6,277,700 | B1 | * | 8/2001  | Yu et al.        | ......................... 438/303 |
| 6,756,314 | B2 | * | 6/2004  | Baier            | ............................. 438/706 |
| 2006/0211260 | A1 | * | 9/2006 | Tran et al.      | ..................... 438/763 |
| 2006/0273456 | A1 | * | 12/2006 | Sant et al.     | ..................... 257/734 |

FOREIGN PATENT DOCUMENTS

| KR | 100574999 B1 | 4/2006 |
| KR | 100685903 B1 | 2/2007 |

* cited by examiner

*Primary Examiner* — Duy Deo
*Assistant Examiner* — Erin Bergner
(74) *Attorney, Agent, or Firm* — Kilpatrick Townsend & Stockton LLP

(57) ABSTRACT

A method for fabricating a micropattern of a semiconductor device is provided. The method includes forming a first hard mask over an etch target layer, forming a first sacrificial layer over the first hard mask, etching the first sacrificial layer to form a sacrificial pattern and forming spacers on both sidewalls of the sacrificial pattern, A second sacrificial layer is formed over the spacers and the first hard mask. A dummy mask is formed in a bent portion of the second sacrificial layer between the adjacent spacers. The sacrificial pattern and the second sacrificial layer are etched using the dummy mask and the spacers as an etch barrier layer to form a dummy pattern between the adjacent spacers. The first hard mask is etched using the spacers and the dummy pattern as an etch barrier layer to form a first hard mask pattern.

17 Claims, 5 Drawing Sheets

METHOD FOR FABRICATING MICROPATTERN OF SEMICONDUCTOR DEVICE

CROSS-REFERENCE TO RELATED APPLICATIONS

The present invention claims priority of Korean patent application number 10-2007-0088214, filed on Aug. 31, 2007, which is incorporated by reference in its entirety.

BACKGROUND OF THE INVENTION

The present invention relates to a semiconductor device, and more particularly, to a method for fabricating a micropattern of a semiconductor device.

As the integration density of semiconductor devices increases, sub-40 nm line and space (LS) is required. However, due to the limitation of existing exposure apparatuses, it is difficult to form sub-60 nm LS.

In order to form sub-60 nm LS while using existing exposure apparatuses, a double patterning technology (DPT) and a spacer patterning technology (SPT) have been proposed.

FIG. 1 illustrates a cross-sectional view of a micropattern of a semiconductor device fabricated by an SPT process. The SPT process fabricates two lines (L) and two spacers (S) within 1 pitch, thus increasing the integration degree of a cell. Although the SPT process can provide two times the integration degree of the cell compared with the typical technology, a new fabrication process is required to further increase the integration degree of the cell.

Furthermore, the semiconductor device includes an etch target layer (a lower structure) 100, a hard mask 101, spacers 102 serving as a pattern mask, and a sacrificial layer 103.

SUMMARY OF THE INVENTION

Embodiments of the present invention are directed to providing a method for fabricating a micropattern of a semiconductor device, which is capable of increasing the integration degree of a cell compared with a typical a spacer patterning technology (SPT) process.

In accordance with an aspect of the present invention, there is provided a method for fabricating a micropattern of a semiconductor device. The method includes forming a first hard mask over an etch target layer, forming a first sacrificial layer over the first hard mask, and etching the first sacrificial layer to form a sacrificial pattern. The method further includes forming spacers on both sidewalls of the sacrificial pattern, forming a second sacrificial layer over the spacers and the first hard mask, forming a dummy mask in a bent portion of the second sacrificial layer between the adjacent spacers, and etching the sacrificial pattern and the second sacrificial layer using the dummy mask and the spacers as an etch barrier layer to form a dummy pattern between the adjacent spacers. The first hard mask is etched using the spacers and the dummy pattern as an etch barrier layer to form a first hard mask pattern.

The method in accordance with the embodiments of the present invention can fabricate a high-integrated semiconductor device having three lines (L) and three spacers (S) within 1 pitch.

DESCRIPTION OF SPECIFIC EMBODIMENTS

Figure 1:
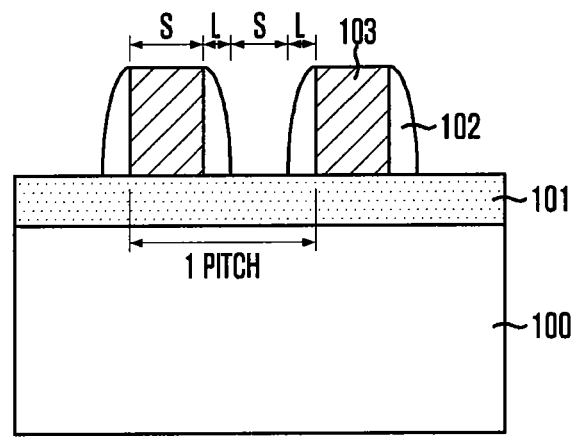
FIG. 1 illustrates a cross-sectional view of a micropattern of a semiconductor device fabricated by a typical SPT process.

Hereinafter, a method for fabricating a micropattern of a semiconductor device in accordance with the present invention will be described in detail with reference to the accompanying drawings. In the drawings, the thicknesses of layers and regions are exaggerated for clarity. It will be understood that when an element such as a layer, a film, a pattern and a region is referred to as being "on/under" another element herein, it may be directly on/under the other element, and one or more intervening elements may also be present. Like reference numerals in the drawings denote like elements throughout the drawings. In addition, changes to the English characters of the reference numerals of layers refer to a partial deformation of the layers by an etch process or a polishing process.

FIGS. 2A to 2I illustrate a method for fabricating a micropattern of a semiconductor device in accordance with an embodiment of the present invention. It will be assumed that a cell gate is an etch target layer.

Figure 2A:
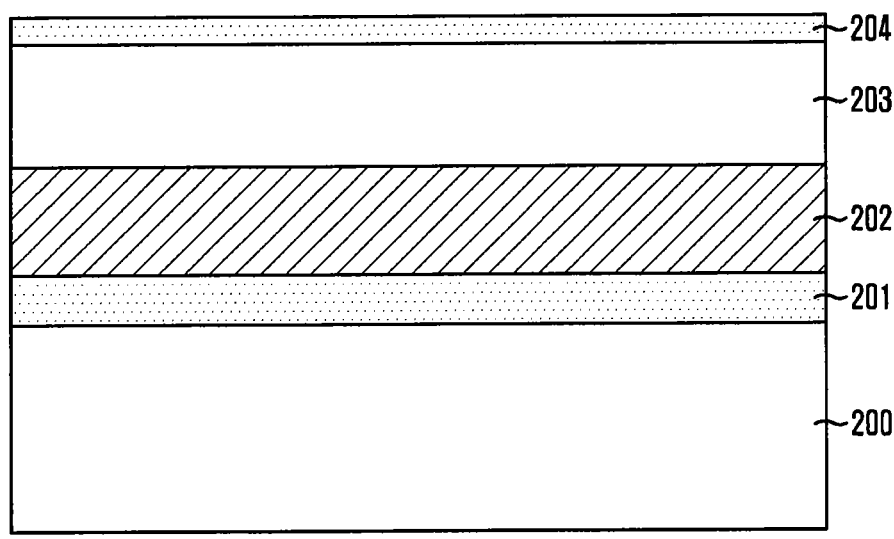
FIGS. 2A to 2I illustrate a method for fabricating a micropattern of a semiconductor device in accordance with an embodiment of the present invention.

Referring to FIG. 2A, an etch target layer 200 is formed over a semiconductor substrate (not shown). The etch target layer 200 may include a conductive layer, a metal layer, a metal nitride layer, a metal silicide layer, or a stacked structure thereof. The conductive layer is formed of impurity-doped polysilicon and the metal layer is formed of transition metal or rare-earth metal. The metal nitride layer is formed of nitride of transition metal and the metal silicide layer is formed of a material produced by reacting transition metal with silicon.

A hard mask 201 (hereinafter, referred to as a first hard mask) is formed over the etch target layer 200. The first hard mask layer 201 may be formed of a material having a low etch selectivity to the etch target layer 200 in order to serve as an etch barrier layer in a process of etching the etch target layer 200. For example, the etch target layer 200 is formed of nitride such as silicon nitride ($Si_3N_4$).

A sacrificial layer 202 (hereinafter, referred to as a first sacrificial layer) is formed over the first hard mask 201. The first sacrificial layer 202 may be formed of a material having a high etch selectivity to the first hard mask 201. For example, when the first hard mask 201 is formed of silicon nitride, the first sacrificial layer 202 is formed of silicon oxide ($SiO_2$). In addition, the first sacrificial layer 202 may be formed of polysilicon silicon or carbon-containing materials, for example amorphous carbon, which can be easily removed by a dry etch process.

A hard mask 203 (hereinafter, referred to as a second hard mask) may be formed over the first sacrificial layer 202. The second hard mask 203 is formed for preventing deformation of immersion photoresist patterns and pattern failures caused by reduction of the etch selectivity. Thus, the second hard mask 203 may be formed of a material having a low etch selectivity to the first sacrificial layer 202. For example, when the first sacrificial layer 202 is formed of silicon oxide, the second hard mask 203 is formed of carbon-containing material.

An anti-reflective coating (ARC) 204 may be formed over the second hard mask 203. The ARC 204 may include a single layer of a bottom anti-reflective coating (BARC) or a stacked structure of a dielectric anti-reflective coating (DARC) and a BARC, where the DARC is formed by a chemical vapor deposition (CVD) process. The CVD-DARC is formed of a material having a refractive index of approximately 1.95 and an extinction coefficient of approximately 0.53, and the BARC is formed of an organic material. When the second hard mask 203 is formed of carbon-containing material, absorptive amorphous carbon, the ARC 204 may include a silicon oxynitride (SiON) layer that is an inorganic anti-reflective coating.

Figure 2B:
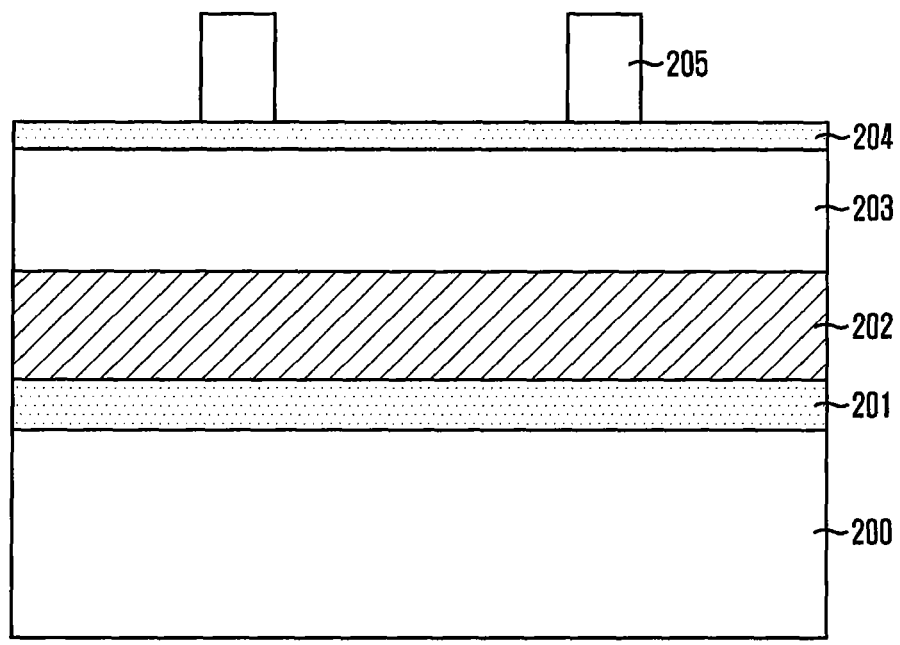

Referring to FIG. 2B, a photoresist layer is coated over the ARC 204. The coated photoresist layer is exposed using a photo mask and developed to form photoresist patterns 205.

Figure 2C:
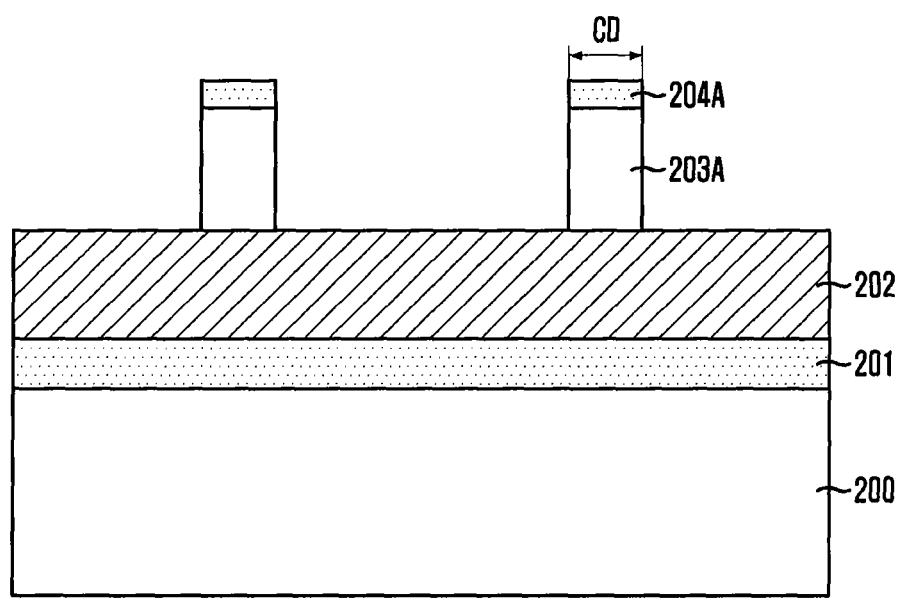

Referring to FIG. 2C, the ARC 204 and the second hard mask 203 are etched using the photoresist patterns 205 (see FIG. 2B) to form ARC patterns 204A and second hard mask patterns 203A. In order to form one more LS within the same pitch compared with a typical SPT process (see FIG. 1), the above etch process is performed such that a critical dimension (CD) of the second hard mask patterns 203A is reduced. To this end, the etch process is performed by an ashing process using oxygen ($O_2$) plasma. In this case, the CD of the second hard mask patterns 203A can be reduced by increasing a flow rate of oxygen.

When the photoresist patterns 205 remain over the ARC patterns 204A after etching the second hard mask patterns 203A, they may be removed by a separate etch process.

When the CD of the second hard mask patterns 203A needs to be further reduced after removing the photoresist patterns 205, an etch process using oxygen plasma may be further performed.

Figure 2D:
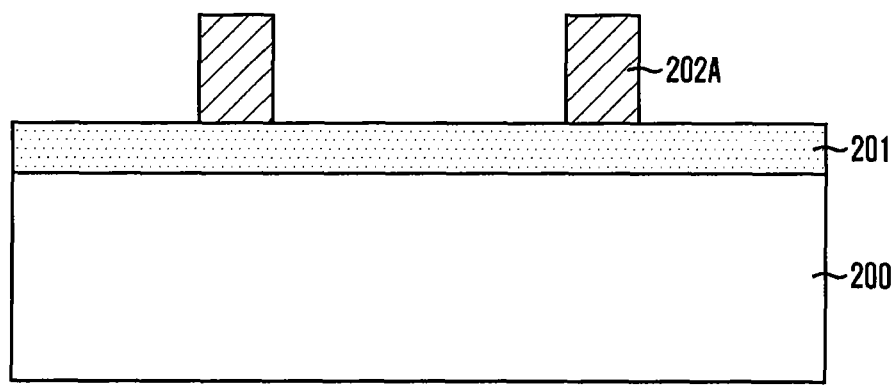

Referring to FIG. 2D, the first sacrificial layer 202 is etched using the second hard mask patterns 203A (see FIG. 2C) to form first sacrificial patterns 202A. The etch process may be performed by a dry etch process or a wet etch process.

The second hard mask patterns 203A (see FIG. 2C) are removed. The removing process may be performed using the first sacrificial patterns 202A and the first hard mask 201 as an etch barrier layer. The removing process may be performed by an ashing process using oxygen plasma in order to minimize the deformation of the first sacrificial patterns 202A. In this way, the first sacrificial patterns 202A are formed over the first hard mask 201.

Figure 2E:
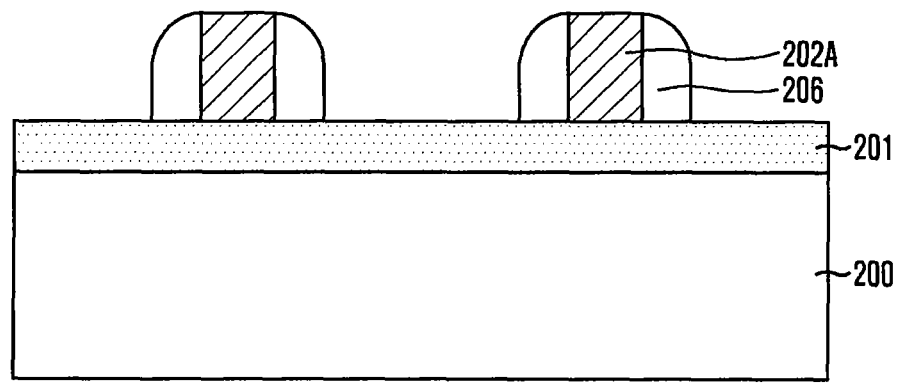

Referring to FIG. 2E, a spacer material layer (not shown) is conformally formed over the first sacrificial patterns 202A and the first hard mask 201. That is, the spacer material layer is formed in a uniform liner over the first sacrificial patterns 202A and the first hard mask layer 201 and is etched to have a vertical profile. In addition, the spacer material layer may be formed of a material having a low etch selectivity to the first sacrificial patterns 202A and the first had mask 201. For example, when the first sacrificial patterns 202A are formed of silicon oxide and the first hard mask 201 is formed of silicon nitride, the spacer material layer may be formed of polysilicon.

The spacer material layer is etched to form spacers 206 on both sidewalls of the first sacrificial pattern 202A. The etch process may be performed by an anisotropic dry etch process using a plasma etch apparatus, in particular, an etch-back process. For example, when the first sacrificial pattern 202A is formed of silicon oxide and the spacer material layer is formed of polysilicon, the etch-back process is performed using $Cl_2$, HBr, or a mixed gas thereof, which has an etch selectivity between the first sacrificial pattern 202A and the spacer material layer.

Figure 2F:
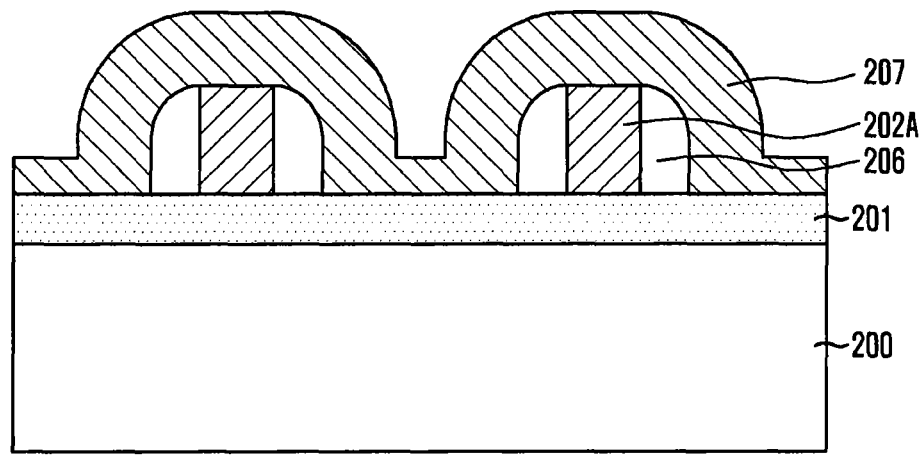

Referring to FIG. 2F, a sacrificial layer 207 (hereinafter, referred to as a second sacrificial layer) is formed conformally over the spacers 206 and the hard mask 201. In this case, the second sacrificial layer 207 is removed together with the first sacrificial patterns 202A through a subsequent etch process and becomes a region for a spacer (S) of the LS. Thus, the second sacrificial layer 207 is formed to a thickness equal to the CD of the first sacrificial pattern 202A and is formed of the same material as the first sacrificial pattern 202A, for example, silicon oxide. Meanwhile, the first sacrificial pattern 202A becomes a region for a line (L) of the LS. In order to form the second sacrificial layer 207 to the thickness equal to the CD of the first sacrificial pattern 202A, the second sacrificial layer 207 is formed in a liner along the top surface of the first hard mask 201. In one embodiment, the second sacrificial layer 207 is formed of tetra ethyl ortho silicate (TEOS) having a high coating rate.

Figure 2G:
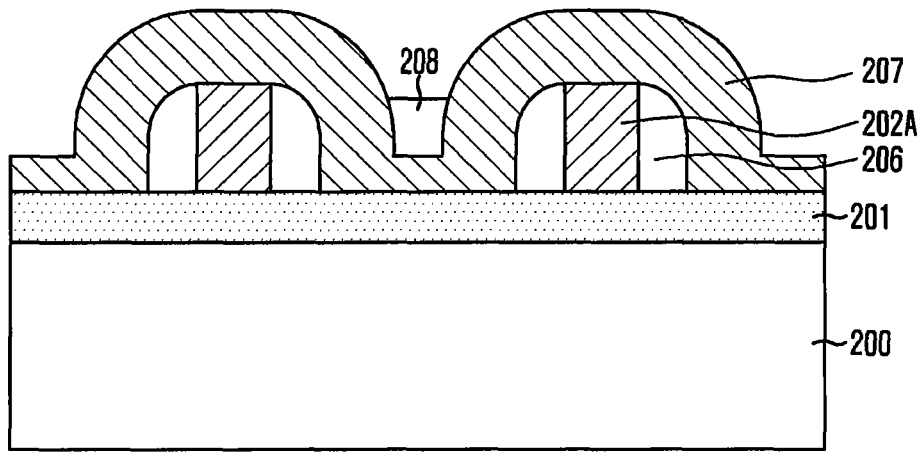

Referring to FIG. 2G, a dummy mask 208 is formed in a bent portion of the second sacrificial layer 207 between adjacent spacers among the spacers 206 formed on the sidewalls of the different first sacrificial patterns 202A. At this point, a dummy mask material layer (not shown) is formed over the second sacrificial layer 207 and etched by a dry etch process using a plasma etch apparatus. In this way, the dummy mask 208 is formed in the bent portion of the second sacrificial layer 207 between the adjacent spacers. The dummy mask material layer can remain on the bent portion of the second sacrificial layer 207 because the dummy mask material layer is formed thickest in the bent portion due to the step caused by the bent portion of the second sacrificial layer 207. The dummy mask 208 is formed of the same material as the spacers 206. For example, the dry etch process is performed by an etch-back process and uses $Cl_2$, HBr, or a mixed gas thereof when the dummy mask is formed of polysilicon and the second sacrificial layer 207 is formed of silicon oxide.

Figure 2H:
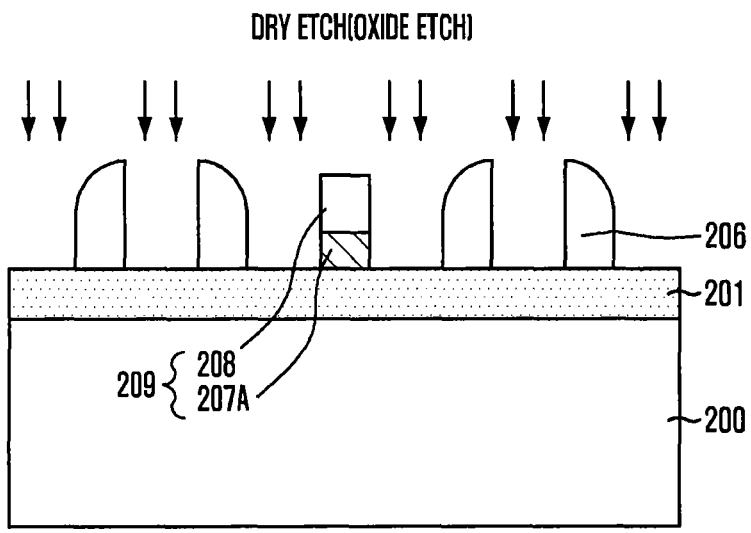

Referring to FIG. 2H, the second sacrificial layer 207 is etched using the spacers 206 and the dummy mask 208 as an etch barrier layer to form a second sacrificial pattern 207A. Through this process, the first sacrificial patterns 202A formed of the same material as the second sacrificial layer 207 are removed to expose the first hard mask 201. In this way, spacer patterns 206 and a dummy pattern 209, which includes the second sacrificial pattern 207A and the dummy mask 208, are formed over the first hard mask 201.

In one embodiment, the etch process may be obtained by singly performing an anisotropic dry etch process using a plasma etch apparatus. In such an embodiment, the etch process is obtained by an etch-back process using a polymer rich gas, for example, carbon fluoride compound. The carbon fluoride compound may include a $C_4F_6$ gas, a $C_4F_8$ gas, a $C_5F_8$ gas, or mixture of thereof. In some embodiments, the etch process may be obtained by sequentially performing a wet etch process and a dry etch process. In such embodiments, the etch process is obtained by etching the second sacrificial pattern 207A to a predetermined thickness using diluted HF (DHF) solution, which is a mixed solution of HF and deionized water (DIW), or buffered oxide etchant (BOE), which is a mixed solution of $NH_4F$ and HF, and removing the remaining second sacrificial pattern 207A and the remaining first sacrificial pattern 202A through a dry etch process, for example an etch-back process. In those embodiments, the wet etch process is primarily performed in order to minimize the loss of the spacers 206 and the dummy mask 208 by reducing the load of the dry etch process.

Figure 2I:
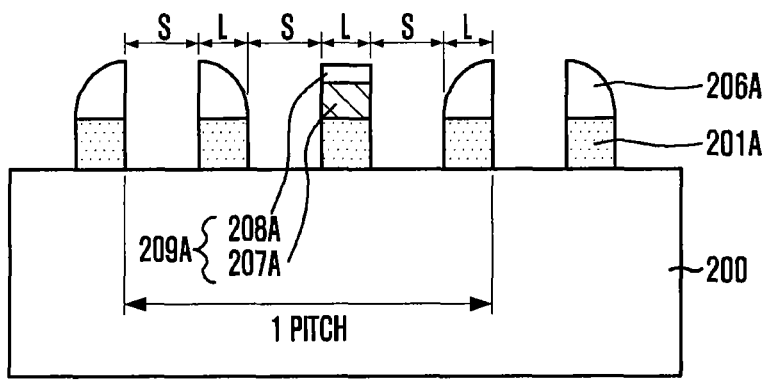

Referring to FIG. 2I, a first hard mask pattern 201A is formed by etching the first hard mask 201 using the spacers 206A and the dummy pattern 209A as an etch barrier layer. The dummy pattern 209A includes an etched dummy mask 208A and the sacrificial patterns 207A. The etch process may be performed by an anisotropic etch process, such as an etch-back process, using a plasma etch apparatus. In this way, a high-integrated semiconductor device having three lines (L) and three spacers (S) within 1 pitch can be fabricated.

Although not shown, the etch target layer 200 is etched using the first hard mask pattern as an etch barrier layer.

Although the gate electrode is used as the etch target layer in the above embodiments, the present invention can also be applied to all materials, including dielectric, which are used in semiconductor devices.

While the present invention has been described with respect to the specific embodiments, the above embodiments of the present invention are illustrative and not limitative. It will be apparent to those skilled in the art that various changes and modifications may be made without departing from the spirit and scope of the invention as defined in the following claims.

What is claimed is:

1. A method for fabricating a micropattern of a semiconductor device, the method comprising:
   forming a first hard mask over an etch target layer;
   forming a first sacrificial layer over the first hard mask;
   etching the first sacrificial layer to form first and second sacrificial patterns;
   forming first and second spacers on either side of the first sacrificial pattern and forming third and fourth spacers on either side of the second sacrificial pattern, with the second and third spacers disposed between the first and second sacrificial patterns;
   forming a second sacrificial layer over the first to fourth spacers, the first and second sacrificial patterns, and the first hard mask, the second sacrificial layer including a bent portion between the second and third spacers;
   forming a dummy mask in the bent portion of the second sacrificial layer;
   etching the first and second sacrificial patterns and the second sacrificial layer using the dummy mask and the first to fourth spacers as an etch barrier layer to form a dummy pattern between the second and third spacers, wherein the dummy pattern comprises the dummy mask and the etched second sacrificial layer on the first hard mask; and
   etching the first hard mask using the first to fourth spacers and the dummy pattern as an etch barrier layer to form a first hard mask pattern,
   wherein the first sacrificial layer and the second sacrificial layer are formed of the same material.

2. The method of claim 1, wherein the second sacrificial layer is formed to a thickness equal to a critical dimension (CD) of the first and second sacrificial patterns.

3. The method of claim 1, wherein the first to fourth spacers and the dummy mask are formed of the same material.

4. The method of claim 1, further comprising, after forming the first sacrificial layer, forming a second hard mask over the first sacrificial layer.

5. The method of claim 4, wherein the first and second sacrificial patterns are formed by:
   etching the second hard mask to form a second hard mask pattern; and
   etching the first sacrificial layer using the second hard mask pattern as an etch barrier layer.

6. The method of claim 5, wherein the etching of the first sacrificial layer is performed by an ashing process using oxygen plasma.

7. The method of claim 5, wherein a critical dimension (CD) of the first and second sacrificial patterns is smaller than that of the second hard mask pattern.

8. The method of claim 5, wherein the second hard mask is formed of carbon-containing material.

9. The method of claim 8, further comprising, after etching the first sacrificial layer, performing an ashing process using oxygen plasma in order to reduce a critical dimension (CD) of the first and second sacrificial patterns.

10. The method of claim 8, wherein the first sacrificial layer and the second sacrificial layer are formed of silicon oxide.

11. The method of claim 4, further comprising, after forming the second hard mask, forming an anti-reflective coating layer over the second hard mask.

12. The method of claim 11, wherein the anti-reflective coating layer is formed of silicon oxynitride.

13. The method of claim 1, wherein the forming of the dummy pattern is obtained by performing a dry etch process or by sequentially performing a wet dry process and a dry etch process.

14. The method of claim 13, wherein the dry etch process is performed by an anisotropic dry etch process using a plasma etch apparatus.

15. The method of claim 1, wherein the etched second sacrificial layer included in the dummy pattern contacts the first hard mask.

16. The method of claim 1, wherein said etching the first sacrificial layer to form a first and second sacrificial patterns is performed before said forming first and fourth spacers on both sidewalls of each of the first and second sacrificial patterns.

17. The method of claim 16, wherein said both sidewalls of each of the first and second sacrificial patterns are exposed during said etching the first sacrificial layer to form a first and second sacrificial patterns.

* * * * *